4,486,683

United States Patent [19]
Newman et al.

[11] Patent Number: 4,486,683
[45] Date of Patent: Dec. 4, 1984

[54] PIEZOELECTRIC TRANSDUCER USING ELECTRICALLY POLED γ-PHASE NYLON 11

[75] Inventors: Brian A. Newman, Highland Park; Kook D. Pae, East Brunswick; Jerry I. Scheinbeim, Somerset, all of N.J.

[73] Assignee: The United States of America as represented by the Secretary of the Navy, Washington, D.C.

[21] Appl. No.: 315,327

[22] Filed: Oct. 26, 1981

[51] Int. Cl.³ .............................................. H01L 41/18
[52] U.S. Cl. ..................................... 310/800; 264/22; 310/311
[58] Field of Search ..................... 264/22, 24; 310/800

[56] References Cited
U.S. PATENT DOCUMENTS

| | | | |
|---|---|---|---|
| 3,976,897 | 8/1976 | Tamura et al. | 310/800 |
| 4,241,128 | 12/1980 | Wang | 264/22 |
| 4,278,000 | 7/1981 | Saito et al. | 310/800 |

Primary Examiner—J. D. Miller
Assistant Examiner—D. Rebsch
Attorney, Agent, or Firm—Robert F. Beers; Arthur A. McGill; Prithvi C. Lall

[57] ABSTRACT

Nylon 11 (γ-phase) is electrically poled after it is crystallized from commercially available nylon 11 by rapidly crystallizing it from the molten state. The γ-phase nylon 11 so obtained exhibits high piezoelectric properties when poled under different poling conditions at different temperatures. The electrically poled γ-phase nylon 11 is used in a transducer.

5 Claims, 6 Drawing Figures

PIEZOELECTRIC TRANSDUCER USING ELECTRICALLY POLED γ-PHASE NYLON 11

BACKGROUND OF THE INVENTION

This invention relates to piezoelectric materials and, more particularly, to electrically poled γ-phase nylon 11 which has desirable piezoelectric characteristics, to be used in acoustic transducers and the like.

Certain polymers have been found to exhibit high piezoelectric activity and have the advantage that they can be formed into films and other desirable shapes. Since the initial discovery of the large piezoelectric response of poled, oriented films of $PVF_2$ by Kawai in 1969, several subsequent studies have been made to explain the mechanisms responsible for this phenomenon. As the greatest piezoelectric activity has been found for $PVF_2$ films, extensive work has been done in the prior art to fabricate various forms of $PVF_2$ polymer and various explanations have been put forward to explain their piezoelectric properties. Mechanisms most often discussed are: a bulk polarization of the sample due to field induced reorientation or switching of the molecular dipoles in the polymer crystals; non-uniform charge injection producing an asymmetric distribution of real charge in the sample; a field induced trapping of injected or ionic charges present as impurities; and some type of surface phenomenon caused by the strong interaction between the positive electrode and the film during poling. Furthermore, efforts have also be made to explore new polymeric materials which exhibit piezoelectric characteristics. As an example, odd nylons have been studied for their piezoelectric behavior by various people. However, little attention has been given to γ-phase nylon because of its non-polar crystalline structure. However, nylon 11 has been studied in its α-phase configuration because of its polar crystalline structure. But α-phase exhibits very low piezoelectric properties. It is thus desirable to explore further any useful behavior exhibited by odd nylons in general, and nylon 11 (γ-phase) in particular, despite the generally held view of its non-polar crystalline structure.

SUMMARY OF THE INVENTION

The objects and advantages of the present invention are accomplished by utilizing a poling technique for nylon 11 (γ-phase) which uses a commercially available nylon 11. The commercially available samples are used which have their melting temperature dependent on the crystallization rate. The samples of nylon 11 which are rapidly crystallized give rise to nylon 11 (γ-phase) at room temperature. The samples thus obtained are studied under different temperature and poling conditions to observe rather high piezoelectric characteristics contrary to the belief that nylon 11 (γ-phase), having non-polar crystalline structure, will not exhibit any piezoelectric characteristics. A transducer using γ-phase nylon 11 as a piezoelectric material has been fabricated.

An object of the subject invention is to obtain nylon 11 in γ-phase and electrically pole it under various poling and temperature conditions.

Another object of the subject invention is to fabricate nylon 11 (γ-phase) from a commercially available sample of nylon 11 and study the piezoelectric characteristics thereof.

Still another object of subject invention is to electrically pole nylon 11 (γ-phase) for acoustic transducer use.

Still another object of the subject invention is to use varied poling and temperature conditions for nylon 11 (γ-phase) so as to obtain optimum conditions for its use in acoustic transducers.

Other objects, advantages and novel features of the invention will become apparent from the following detailed description of the invention when considered in conjunction with the accompanying drawings wherein:

DESCRIPTION OF A PREFERRED EMBODIMENT

The method of fabricating nylon 11 (γ-phase) involved preparing work samples from nylon 11 films 3 mil (1 mil = $10^{-3}$ inch) thick which was obtained from Rilsan Corporation. It should be clearly understood that similar samples can be obtained from any other available source without deviating from the teachings of the subject invention. The samples were studied, using a Perkin Elmer 1B Differential Scanning Calorimeter and a Phillips X-ray diffractometer. The melting temperature was found to be dependent on the crystallization rate. Those samples which were rapidly crystallized gave rise to an endothermic peak at 189° C. and were oberved to be γ-phase at room temperature. Samples that were slowly crystallized, giving rise to an endothermic peak at 182° C., were observed to be α-phase at room temperature. It should be clearly pointed out that no attempt had been made to electrically pole nylon 11 (γ-phase) in the prior art because of its supposed non-polar crystalline structure.

Figure 1:
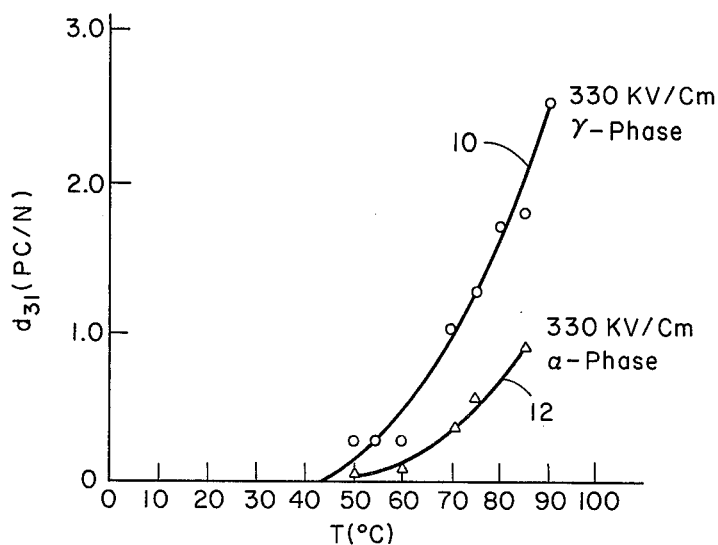
FIG. 1 is a gaphical representation of the strain coefficients ($d_{31}$) for both γ and α-phase of nylon 11.
Figure 2:
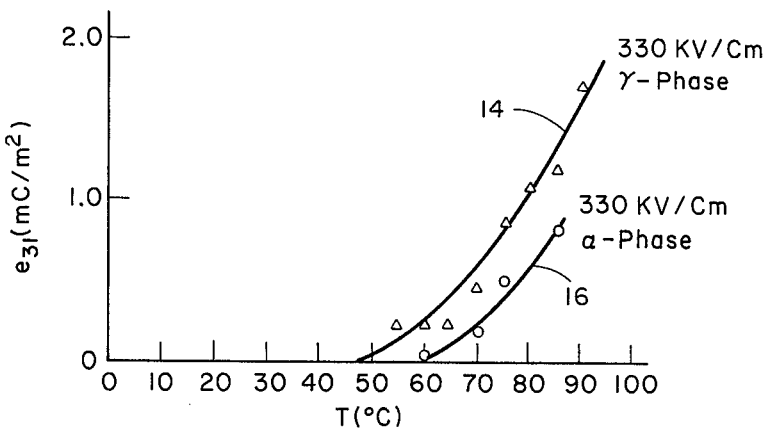
FIG. 2 is a graphical comparison of the poling temperature dependence of stress constant ($e_{31}$) nylon 11 films containing the α-form or γ-form.
Figure 3:
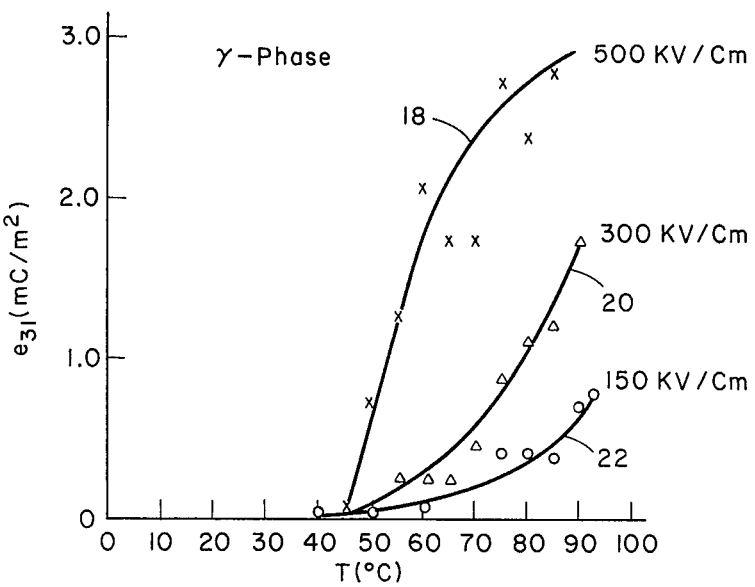
FIG. 3 is a graphical representation of the poling temperature dependence of piezoelectric stress co-efficients $e_{31}$ for γ-phase nylon 11 at different poling fields.
Figure 4:
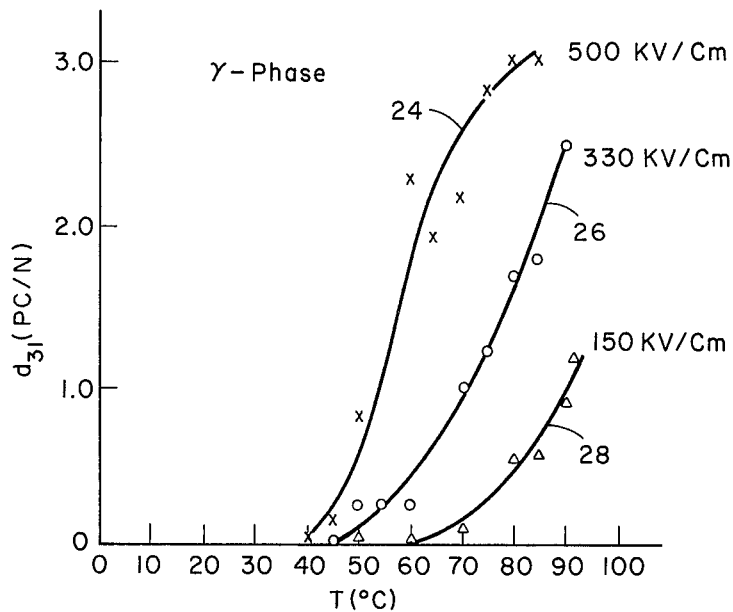
FIG. 4 is a graphical representation of the poling temperature dependence of piezoelectric strain co-efficient ($d_{31}$) for nylon 11 at different poling fields.

FIG. 1 shows the comparison between values of strain co-efficient ($d_{31}$) for γ-phase and α-phase nylon 11 wherein curve 10 represents variation of $d_{31}$ as a function of poling temperature for γ-phase nylon 11 and curve 12 shows $d_{31}$ variation for α-phase nylon 11. FIG. 2 graphically shows a comparison of the poling temperature dependence of stress co-efficient $e_{31}$ for γ-phase and α-phase nylon 11 films wherein curves 14 and 16 represent change in $e_{31}$ as a function poling temperature for γ-phase and α-phase, respectively. As can be seen from FIGS. 1 and 2, the values of $d_{31}$ and $e_{31}$ for γ-phase nylon 11 are markedly higher than those for α-phase nylon 11. This unique feature of current investigation has not been known in the prior art due to the commonly held view that γ-phase nylon 11 cannot be poled because of its non-polar crystalline structure. FIGS. 3 and 4 indicate graphically variation with poling temperature of $d_{31}$ and $e_{31}$ respectively for γ-phase nylon 11. Curves 18, 20 and 22 show the poling temperature dependence of $e_{31}$ at poling fields of 500 kV/cm, 300 kV/cm and 150 kV/cm, respectively. Curves 24, 26 and 28 of FIG. 4 indicate poling temperature dependence of $d_{31}$ at poling fields of 500 kV/cm, 330 kV/cm and 150 kV/cm, resectively. The high poling fields without dielectric breakdown were achieved using a thick silver paste for electrodes during poling. A conventional high voltage power supply was used to produce poling fields up to 500 kV/cm.

Figure 5:
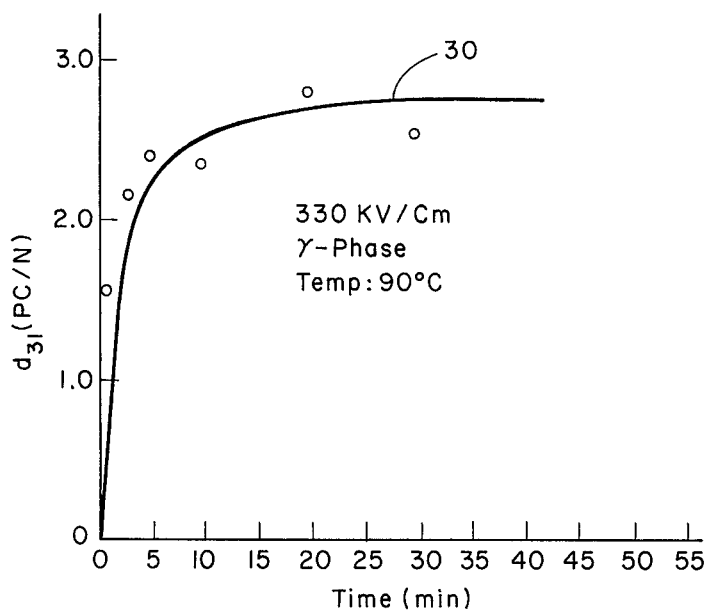
FIG. 5 represents graphically the poling time dependence of $d_{31}$ for γ-phase nylon 11 poled at 330 kV/cm at 90° C.

FIG. 5 graphically indicates poling time dependence of $d_{31}$ for γ-phase nylon 11 film poled at 300 kV/cm at 90° C. As can be shown by curve 30 in FIG. 5, most of the $d_{31}$ value for γ-phase nylon 11 is obtained within 5 minutes of the poling time. As can be seen from FIGS. 1-5, it is evident for equivalent poling conditions the piezoelectric activity obtained from the α-phase nylon 11 films is much less than that obtained from the γ-phase nylon 11 films which has been considered to have non-polar crystalline structure.

Figure 6:
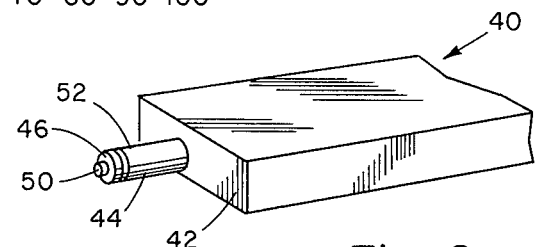
FIG. 6 is a perspective view of a transducer using γ-phase nylon 11 as the active piezoelectric material.

FIG. 6 shows a perspective view of a transducer 40 using γ-phase nylon 11 as the active piezoelectric material. Transducer 40 includes a long and flat outer layer 42 and a piezoelectric cable 44 is buried in outer layer 42. Piezoelectric cable 44 is provided with a piezoelectric layer or sheet 46 of γ-phase nylon 11 rolled on the outer periphery of a center electrode 50 which is made of a thin metallic wire. The outer electrode 52 made of a thin metallic film is formed on the outer periphery of layer 46. In operation, when pressure induced by an acoustic signal is exerted on outer layer 42, it is transmitted to layer 46 of γ-phase nylon 11 and electrical potential is generated between electrodes 50 and 52. Conversely, a pressure wave is generated by the transducer when an electrical signal is applied between the two electrodes 50 and 52. It should be noted that one of the novel features of subject invention is in the use of electrically poled γ-phase nylon 11 as the active material in standard transducer configurations.

Briefly stated, γ-phase nylon 11 crystalline structure is obtained by rapidly crystallizing molten nylon films which results in γ-phase thereof. The γ-phase nylon 11 films are then electrically poled under various poling and temperature conditions to exhibit its usefulness as a piezoelectric polymer for transducer use or the like.

Obviously, many modifications and variations of the subject invention are possible in the light of the above teachings. As an example, different types of commercially available nylon 11 can be used to obtain γ-phase nylon 11. Furthermore, pressure and temperature and heating and cooling rates can be changed to optimize conditions to obtain a high percentage of γ-phase nylon 11. Besides, various configurations of the transducer using γ-phase nylon 11 as the active piezoelectric material are possible without deviating from the teachings of subject invention. It is, therefore, to be understood that within the scope of the appended claims, the invention may be practiced otherwise than as specifically described.

What is claimed is:

1. A piezoelectric transducer which comprises:
   an electrically poled γ-phase nylon 11 sample;
   a pair of electrodes electrically connected to said γ-phase nylon 11 sample.

2. The transducer of claim 1 wherein said γ-phase nylon 11 sample is in the form of a sheet rolled on a first of said pair of electrodes with the inner surface of said sheet being in contact with the first of said pair of electrodes.

3. The transducer of claim 2 wherein the first of said pair of electrodes is a metallic wire.

4. The transducer of claim 3 wherein the second of said pair of electrodes is a metallic film in contact with the outer surface of said sheet of γ-phase nylon 11.

5. The transducer of claim 4 wherein said sheet of γ-phase nylon 11 is embedded in a flat outer layer.

* * * * *